(12) United States Patent
Zeiger et al.

(10) Patent No.: US 7,385,398 B2
(45) Date of Patent: Jun. 10, 2008

(54) RADIO FREQUENCY COIL ARRANGEMENT FOR MAGNETIC RESONANCE MEASUREMENTS AND PROBE HEAD FOR MEASURING RESONANCE SIGNALS BY UTILIZING SUCH A RADIO FREQUENCY COIL ARRANGEMENT

(75) Inventors: Heinz Zeiger, Waldbronn (DE); Baudouin Dillmann, Strasbourg (FR)

(73) Assignee: Bruker BioSpin GmbH, Rheinstetten-Forchheim (DE)

( * ) Notice: Subject to any disclaimer, the term of this patent is extended or adjusted under 35 U.S.C. 154(b) by 189 days.

(21) Appl. No.: 11/438,076

(22) Filed: May 19, 2006

(65) Prior Publication Data
US 2007/0268077 A1 Nov. 22, 2007

(30) Foreign Application Priority Data
May 20, 2005 (DE) .................. 10 2005 024 773

(51) Int. Cl.
*G01V 3/00* (2006.01)
(52) U.S. Cl. ............................. 324/318; 324/322
(58) Field of Classification Search ........ 324/300–322; 600/407–455; 343/700, 702; 118/723
See application file for complete search history.

(56) References Cited

U.S. PATENT DOCUMENTS

| | | | | |
|---|---|---|---|---|
| 5,291,169 A | * | 3/1994 | Ige et al. ..................... | 335/216 |
| 5,304,971 A | * | 4/1994 | Sturman et al. ............. | 335/126 |
| 6,229,487 B1 | * | 5/2001 | Sadler et al. ........ | 343/700 MS |
| 6,523,493 B1 | * | 2/2003 | Brcka ....................... | 118/723 I |
| 6,621,455 B2 | * | 9/2003 | Wang et al. ......... | 343/700 MS |
| 6,915,152 B2 | * | 7/2005 | Zhu ........................... | 600/422 |
| 2005/0253760 A1 | * | 11/2005 | Liu et al. .................... | 343/702 |

FOREIGN PATENT DOCUMENTS

| | | |
|---|---|---|
| JP | 01046637 A | 2/1989 |
| JP | 64046637 A | 3/1989 |
| JP | 04271603 A | 9/1992 |
| WO | WO 2006/012619 A2 | 2/2006 |

OTHER PUBLICATIONS

Grant, S.C., et al., "Analysis of Multilayer Radio Frequency Microcoils for Nuclear Magnetic Resonance Spectroscopy", IEEE Transactions on Magnetics, vol. 37, No. 4, Jul. 2001.
Stringer, et al., "Reduction of RF-Induced Sample Heating With a Scroll Coil Resonator Structure for Solid-State NMR Probes", Journal of Magnetic Resonance 173 (2005) 40-48, Elsevier, Inc.

* cited by examiner

*Primary Examiner*—Brij Shrivastav
(74) *Attorney, Agent, or Firm*—Law Offices of Paul E. Kudirka

(57) ABSTRACT

A radio frequency coil arrangement for magnetic resonance measurements as well as a probe head for measuring resonance signals by utilizing such a radio frequency arrangement are disclosed. The radio frequency coil arrangement comprises a scroll coil having a stripe being spirally wound about a longitudinal axis, and having ends being provided with terminals for feeding and/or receiving radio frequency signals. The stripe, as seen in a plane unwound view, is configured in a Z-shape with a middle, broad section as well as two lateral, narrow sections being offset with respect to each other in a lateral direction, such that the lateral sections do not overlap in the lateral direction when the stripe is wound.

18 Claims, 6 Drawing Sheets

(Prior Art) Fig.2

RADIO FREQUENCY COIL ARRANGEMENT FOR MAGNETIC RESONANCE MEASUREMENTS AND PROBE HEAD FOR MEASURING RESONANCE SIGNALS BY UTILIZING SUCH A RADIO FREQUENCY COIL ARRANGEMENT

FIELD OF THE INVENTION

The invention, generally, relates to the field of magnetic resonance.

More specifically, the invention relates to the field of resonators and probe heads for magnetic resonance measurements, in particular for nuclear magnetic resonance measurements on very small samples having dielectric losses, like liquid, semi-liquid or salt-containing solid state samples.

Still more specifically, the invention relates to a radio frequency coil arrangement for magnetic resonance measurements comprising a scroll coil having a stripe being spirally wound about a longitudinal axis, the ends of which being connected to terminals for feeding and/or receiving radio frequency signals.

The invention is, further, related to a probe head for measuring resonance signals utilizing such a radio frequency coil arrangement.

BACKGROUND OF THE INVENTION

A radio frequency coil arrangement as well as a probe head of the type specified above are disclosed in an article of Stringer, John A. et al. "Reduction of RF-induced sample heating with a scroll coil resonator structure for solid state NMR probes", Journal of Magnetic Resonance, 173, (2005), pp. 40-48, as well as in an article of Grant, S. C. "Analysis of Multilayer Radio Frequency Microcoils for Nuclear Magnetic Resonance Spectroscopy", IEEE Transactions on Magnetics, 37, (2001), pp. 2989-2998.

Japanese patent application publication JP 01-046 637 A discloses a spiral resonator. This spiral resonator, in a plane, developed view, consists of a narrow, rectangular metal sheet which is then wound such that a circular loop is generated in which the ends of the wound metal sheet slightly overlap and are arranged at a small distance from one another. The resonator is intended to be used for electron resonance (ESR) and nuclear resonance (NMR) measurements, in particular for measurements on samples having high dielectric losses.

Coil arrangements and probe heads of the type of interest in the context of the present invention are, preferably, used for nuclear magnetic resonance (NMR) measurements on small samples having losses. However, this does not exclude the application of the invention to other methods, in particular electron spin resonance (ESR).

Insofar, the small volume may result, on the one hand, from the fact that there are just only little amounts of sample substance available. On the other hand, the sensitivity of magnetic measurements increases, as is well known, when the measuring frequency is increased, or the constant, homogeneous magnetic field strength, resp., in which the samples are located. The higher the measuring frequency or the smaller the wavelength, resp., the smaller are the dimensions of the coil or resonator arrangements receiving the sample. The term "small sample" is to be understood to mean sample volumes of the order of magnitude of 50 µl. Such samples, typically, have dielectric losses, when it comes to liquid, semi-liquid or salty solid state samples. The lossy samples effect a decrease of the quality factor as well as a detuning of the frequency in the radio frequency coil arrangement used, all resulting in reduced sensitivity.

The conductivity of the sample substance in such cases results in a coupling with the electrical radio frequency field. When conceiving coil arrangements and probe heads for magnetic resonance measurements, one has, therefore, the desire to configure the spatial distribution of the electrical field on the one hand and the spatial location of the sample substance on the other hand, such that the smallest possible zones of overlap exist.

In conventional solenoid coils a wire-shaped conductor is helically wound about a cylindrical volume into which a sample container may be inserted. If a radio frequency signal is fed thereto, the radio frequency magnetic field permeates the volume and, hence, the sample, in an axial direction. However, when doing so, a non-negligible electrical stray field occurs which, in connection with samples of the type mentioned above, results is substantial dielectric losses with the consequences lined out above.

It has turned out that this problem becomes the more severe, the smaller the coil and the sample volume, resp., are made. When the sample volumes are very small, i.e. in the range of several 10 µl, then sensitivity may drop to unacceptable values.

From the articles of Stringer and of Grant, cited at the outset, wound coils, the so-called "scroll coils", have become known. These coils are made by spirally winding a small rectangle shaped and electrically conductive stripe about an axis. The scroll coil terminals or connectors are then located at the inner and at the outer narrower sides of the wound stripe. This coil configuration is characterized by a smaller electrical stray field in the area close to the coil axis. It has, therefore, turned out to be advantageous for small sample volumes.

The prior art scroll coils, however, have the disadvantage that due to the extremely confined space it is difficult to make the terminal at the inner narrow side of the wound stripe, in particular for the very small coils as are of interest in the present context. The cross-wise outward connection of the terminal from the area close to the axis, further, results in an asymmetrical arrangement. When the latter is driven asymmetrically, the inner terminal is electrically "cold" (low radio frequency voltage) and the outer terminal is electrically "hot" (high radio frequency voltage).

SUMMARY OF THE INVENTION

It is, therefore, an object underlying the invention, to improve a radio frequency coil arrangement as well as a probe head of the type specified at the outset such that these disadvantages are avoided. In particular it shall become possible to excite magnetic resonance within small sample volumes at low dielectric losses and to receive same therefrom, resp., wherein the coil arrangement used shall be simple to connect and shall be adapted to be driven symmetrically.

In a radio frequency coil arrangement of the type specified at the outset, this object is achieved in that the stripe, as seen in a plane unwound view, is configured in a Z-shape with a middle, broad section as well as two lateral, narrow sections being offset with respect to each other in a lateral direction, such that the lateral sections do not overlap in the lateral direction when the stripe is wound.

In a probe head of the type specified at the outset, the object is achieved in that the radio frequency coil arrangement is driven symmetrically at the terminals of the scroll coil.

The object underlying the invention is, thus, entirely solved.

The Z-shaped configuration of the stripe with narrow ends which do not overlap in a lateral direction allow a coil configuration in which the terminals are symmetrically arranged. This, on the one hand, enables a crossing-free electrical connection, and, on the other hand, a symmetrical driving of the coil arrangement.

In a preferred embodiment of the invention, the lateral sections are arranged at a distance with respect to each other in the lateral direction.

This measure has the advantage that the narrow ends may be guided past another without the danger that a short circuit is generated. This is of particular importance for radio frequency voltages.

In preferred embodiments the middle section is essentially three times as wide as the lateral sections.

This dimensioning has turned out to be advantageous within practical experiments.

A good effect is achieved when the middle section is configured slanted in the transition to the lateral sections.

This measure has the advantage that the stripe may easily be cut by making straight cuts from a flat web, for example from a foil provided with a conductive coating.

As an alternative, the middle section, however, may also be configured arcuate in the transition to the lateral sections.

This measure has the advantage that by making the transitions non-straight, the current distribution within the stripe may be optimized in the transition between the narrower sections to the broader section.

In embodiments of the invention it is preferred when the middle section, when in a wound condition, entwines the longitudinal axis by an angle of almost 360°.

This measure has the advantage that the interior space of the coil arrangement, i.e. the sample space as such, is configured solely by the wound middle, broader section, which means that the conductive surface of the stripe encloses an essentially cylindrical volume. This has a positive result on the current distribution and, hence, on the formation of the radio frequency field within the sample space with only minimum stray components of the electrical field.

In this context it is preferred when the lateral sections in a wound condition, each entwine the longitudinal axis by an angle of about 360°.

This measure has the advantage that the ends of the narrow sections, again, come to a small distance with respect to another, which facilitates the electrical connection thereof.

It is preferred when the lateral sections, when in a wound condition, entwine the longitudinal axis by an angle of approximately an integer multiple of 180°. Preferably, the lateral sections have equal lengths, and, still more preferably, the middle section has essentially the same length as the lateral sections.

In an embodiment of the invention the terminals are coupled essentially to the center of lateral sides of the lateral sections.

This measure has the advantage that the current distribution is already optimized within the narrow sections.

The invention, preferably, is used such that the stripe, when in a wound condition, encircles an inner space for a sample volume in the range of between 10 to 100 µl.

This measure has the advantage that the invention may be used in that particularly important area of analytics, in which only very small sample volumes are available.

Insofar it is preferred when the scroll coil is designed for a resonance frequency in the range of between 400 to 1,000 MHz.

This measure has the advantage that one may work within a measuring range which, due to the high measuring frequency and the high magnetic field strength of the constant magnetic field, resp., enables a high sensitivity.

A particularly preferred embodiment of the invention is characterized in that the radio frequency coil arrangement is operated in the range of the resonance frequency of the scroll coil, preferably below the resonance frequency.

This measure has the advantage that the coil arrangement is operated as a resonator, such that a particularly high radio frequency magnetic field strength is achieved within the sample space.

In preferred embodiments of the inventive probe head, the terminals are each connected to an end of an inner conductor of lines, resp., having a length being essentially equal to one half wave length of a first measuring frequency for nuclei of a first kind of nuclei, wherein signals of the first measuring frequency are fed to or received from, resp., the opposite end of one of the inner conductors.

This measure has the advantage that a symmetrical operation of the probe head is possible, in which both terminals of the coil arrangement are "hot".

In a further developed version of this embodiment, signals of a second measuring frequency for nuclei of a second kind of nuclei are fed to or received from, resp., a middle tap of the other inner conductor.

This measure has the advantage that measurements on nuclei of two or more kinds of nuclei become likewise possible, in which, for example, the one kind of nuclei is saturated, and the other kind of nuclei is observed.

Further advantages will become apparent from the description and the enclosed drawing.

It goes without saying that the above-mentioned features and those that will be discussed hereinafter, may not only be used in the particularly given combination but also in other combinations, or alone, without leaving the scope of the present invention.

BRIEF DESCRIPTION OF THE DRAWINGS

The above and further advantages of the invention may be better understood by referring to the following description in conjunction with the accompanying drawings in which.

DETAILED DESCRIPTION

Figure 1:
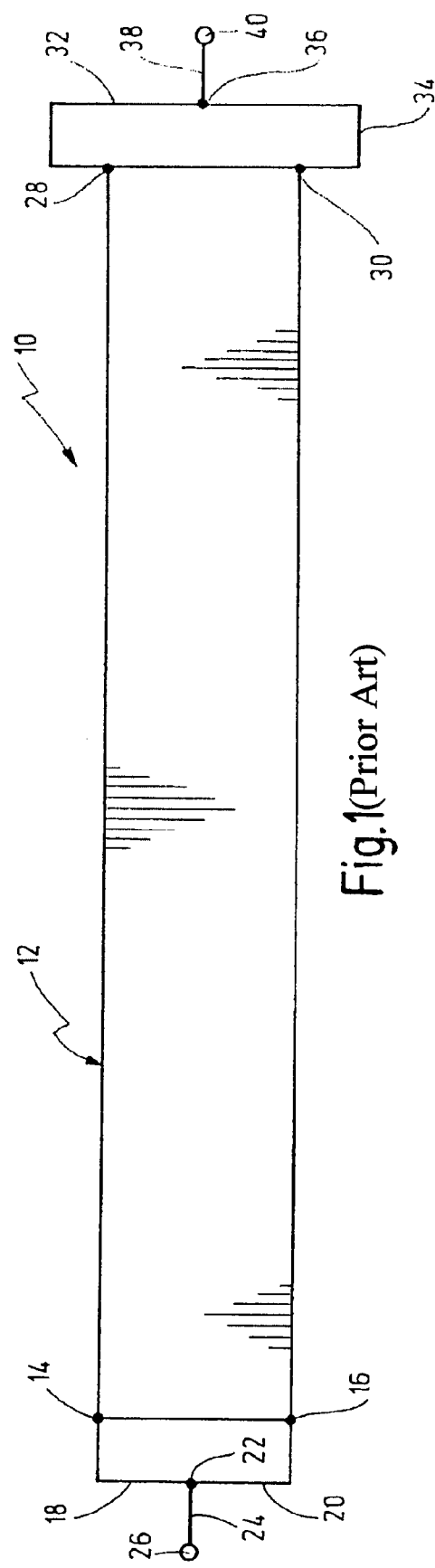
FIG. 1 shows a scroll coil according to the prior art, in an unwound condition.
Figure 2:
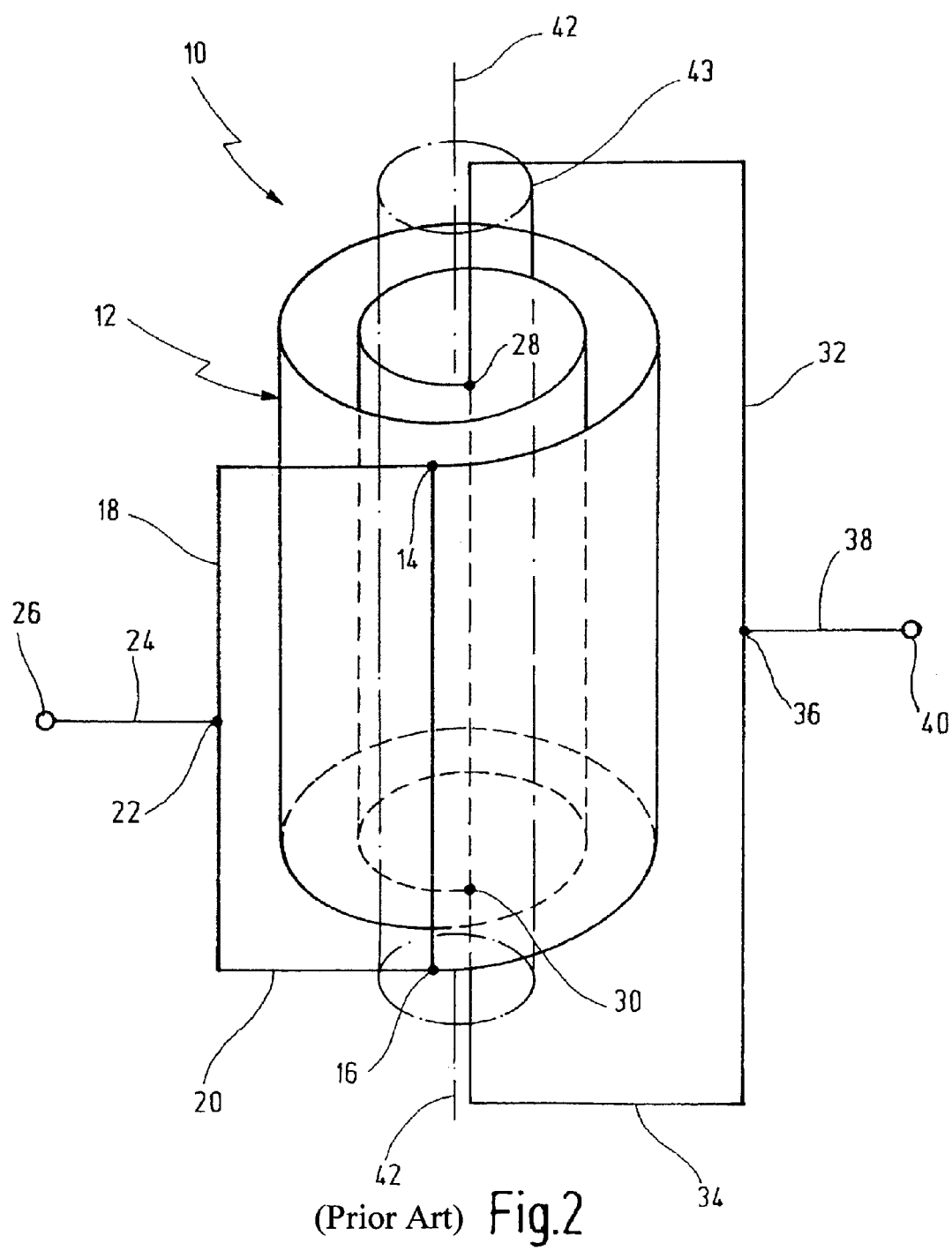
FIG. 2 shows the coil of FIG. 1, however, in a wound condition.

In FIGS. 1 and 2 reference numeral 10 designates a wound coil according to the prior art, referred to in the art as "scroll coil". Scroll coil 10 essentially consists of a stripe 12 having a narrow, rectangular shape.

Left in FIG. 1, on a narrow side of stripe 12 there are depicted a first, upper corner 14 as well as a second, lower corner 16. By means of equally long line sections 18 and 20, corners 14, 16 are connected to a node 22 from which another line section 24 leads to a first terminal 26. Right in FIG. 1 there are on mirror-symmetrical positions a third, upper corner 28 as well as a fourth, lower corner 30 on a narrow side of stripe 12. Line sections 32 and 34 are guided from corners 28 and 30 to a node 36, and therefrom via another line section 38 to a second terminal 40.

As one can clearly see from FIG. 1, line sections 18 and 20 extend on the left side first as elongations of longitudinal sides of stripe 12, whereas line sections 32 and 34 first extend as elongations of the right lateral side.

This measure makes sense as shown in FIG. 2 where scroll coil 10 is depicted in its wound condition. The narrow side of stripe 12 having been on the left side in FIG. 1 lies outside in this condition and the right narrow side lies inside, close to a longitudinal axis 42 of scroll coil 12 being also the longitudinal axis for a sample container which may be inserted there. Now, whereas line sections 18 and 20 may be guided away in elongation of the longitudinal sides of stripe 12, this is impossible with line sections 32 and 34. These must be crossed, i.e. they must, first, be guided axially and, then, radially to the outside.

In view of the relatively large width of stripe 12, the radio frequency signal must be fed to the corners 14, 16, 28, and 30 in the interest of a homogeneous current distribution, such that, seen as a whole, a relatively complicated and asymmetrical design results.

Figure 3:
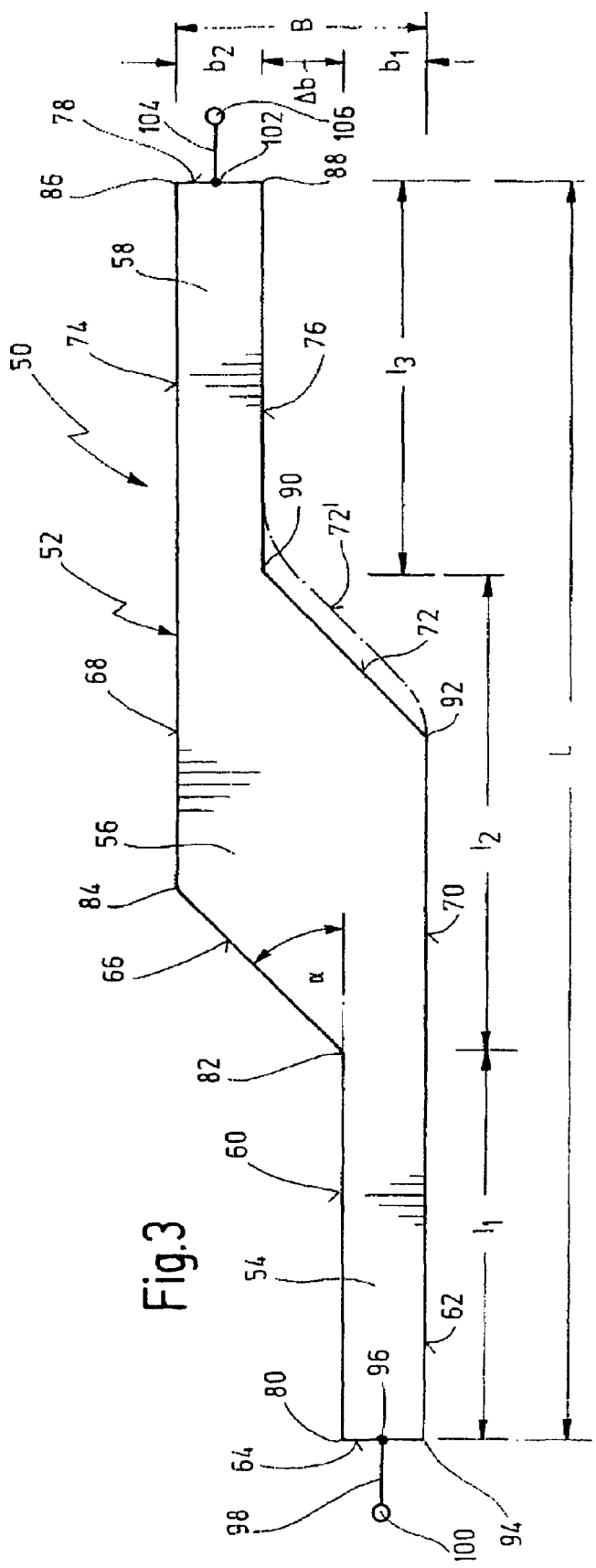
FIG. 3 shows a scroll coil according to the invention, in an unwound condition.
Figure 4:
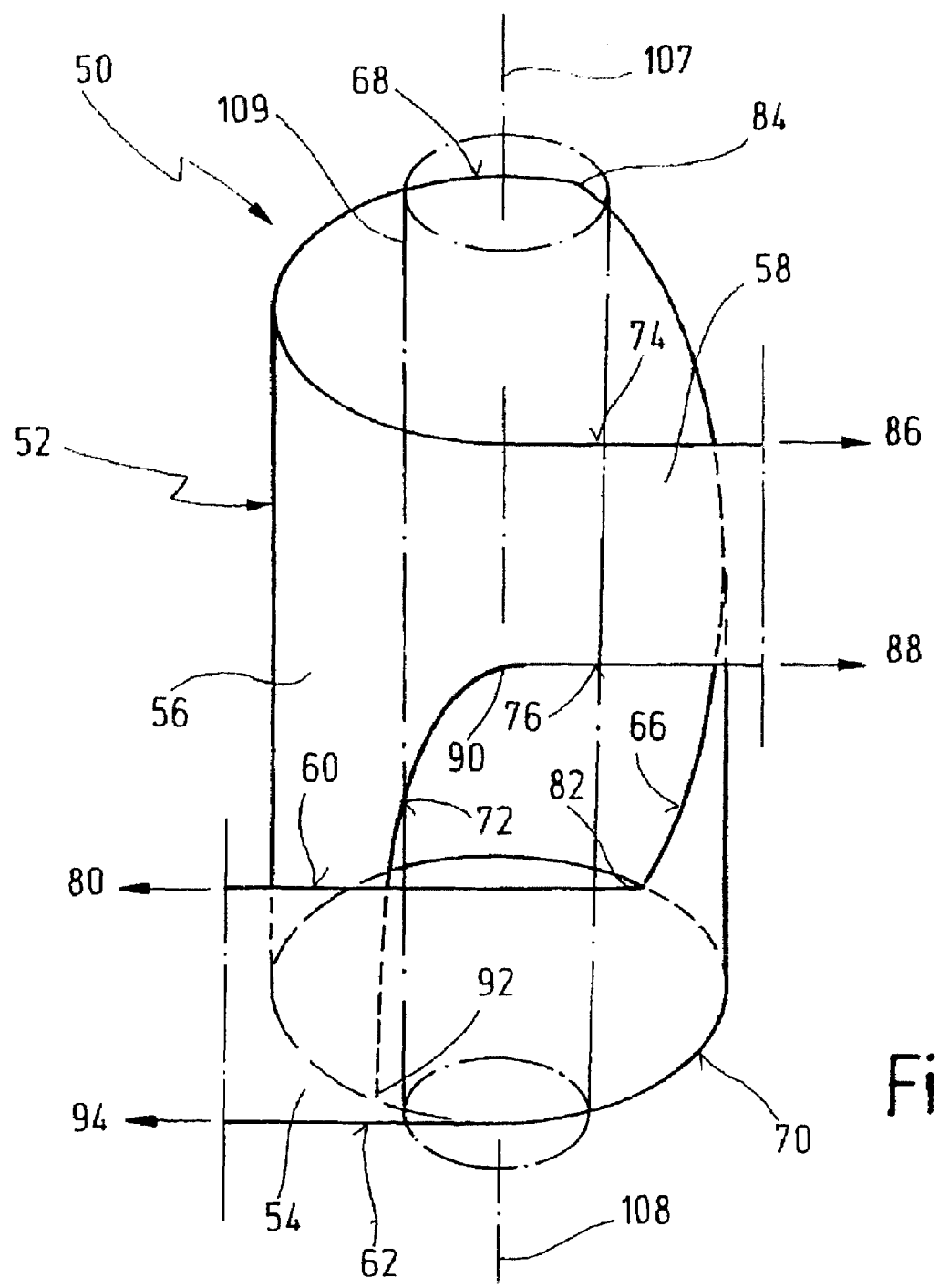
FIG. 4 shows the coil of FIG. 3, however, in a wound condition.
Figure 5:
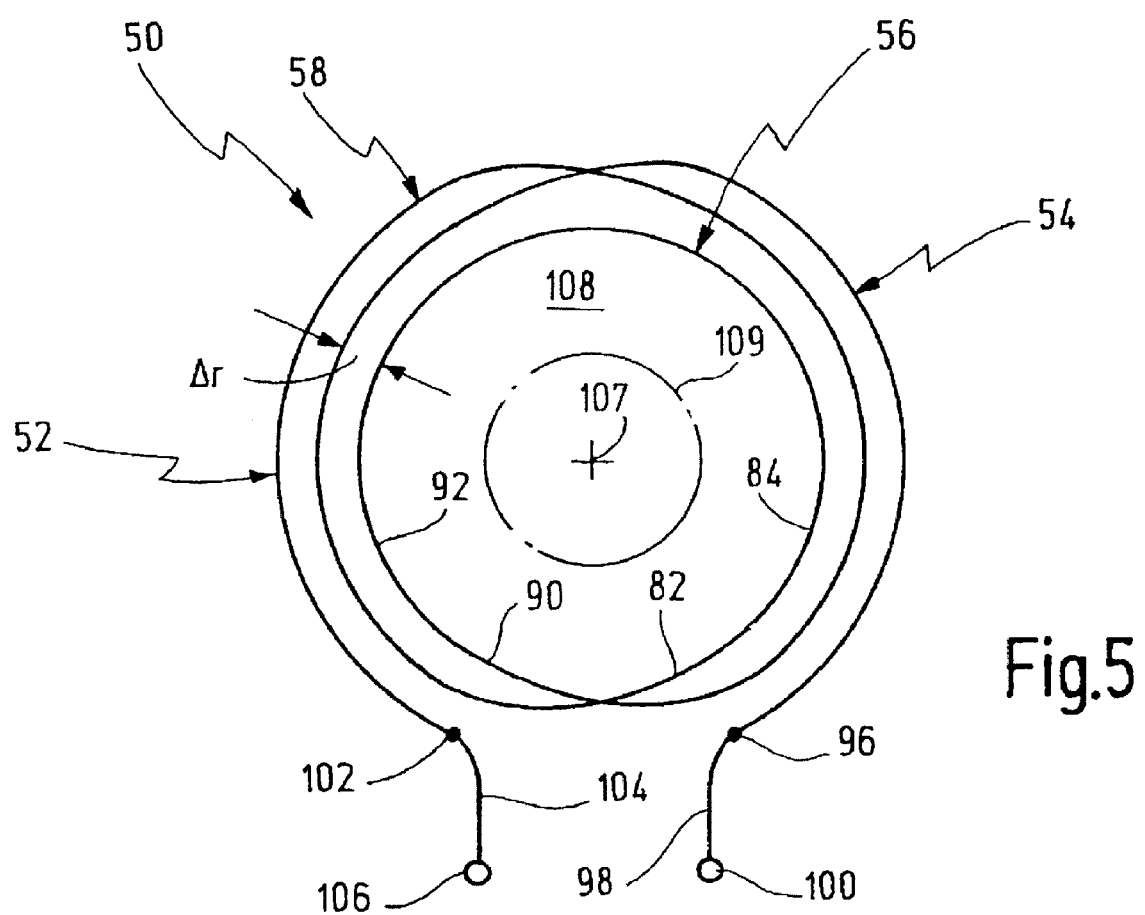
FIG. 5 shows the coil of FIG. 4 in a top plan view.

This is different in the embodiment of the invention shown in FIGS. 3 to 5. In that embodiment a scroll coil 50 is used which, as can clearly be seen from FIG. 3, consists of a Z-shaped stripe 52.

Stripe 52 comprises a left, narrow section 54 of width $b_1$, a middle, broad section 56 of width B, and a right, narrow section 58 of width $b_2$. Left section 54 is a continuation of middle section 56 at the bottom thereof, whereas right section 58 is a connection to the top of middle section 56. Left section 54 is offset with respect to right section 58 in a lateral direction, i.e. in a vertical direction in FIG. 3, by a distance Δb. Preferably, the equation $$b_1 = b_2 = \tfrac{1}{3}\Delta b$$

applies. Stripe 52 has an overall length L. The length of left section 54 is $l_1$, that of middle section 56 is $l_2$ and that of right section 58 is $l_3$. The three sections 54, 56, and 58, preferably, have the same length, as will be explained in further detail with regard to FIGS. 4 and 5. The narrower sections 54 and 58 may, however, also be essentially longer than broader section 56.

In the depiction of FIG. 3, left section 54 has a first, straight, upper longitudinal side 60, a second, straight, lower longitudinal side 62 parallel thereto, and a first lateral side 64. At its right end, first longitudinal side 60 continues as a third, slanted, upper longitudinal side 66 of middle section 56, namely under an angle α of, for example, about 45°.

Third longitudinal side 66, in turn, continues at its right end under an angle 180°-α into a fourth, straight, upper longitudinal side 68 of middle section 56. Middle section 56 at its lower side has a fifth, straight, lower longitudinal side 70 being flush with the second longitudinal side 62 of left section 54. At its right end fifth longitudinal side 70 continues into a sixth, slanted, lower longitudinal side 72 of middle section 56, preferably in an orientation parallel to third longitudinal side 66, i.e. likewise under an angle α.

Fourth longitudinal side 68 of middle section 56 is flush with a seventh, straight, upper longitudinal side 74 of right section 58. At the underside of the latter is an eighth, straight, lower longitudinal side 76, parallel thereto which, as a consequence, extends under an angle 180°-α relative to sixth longitudinal side 72. Right section 58, at the right end thereof, is terminated by a second lateral side 78.

In FIG. 3, dash-dot line 72' indicates that the transitions between the respective straight longitudinal sides, i.e. essentially the longitudinal sides 66 and 72, may also be configured arcuate. This may make sense for influencing the current distribution within stripe 52, for example in the meaning of a current density homogenization.

Stripe 52, as known per se, may be cut from an electrically conductive web material, for example from a polytetrafluorethylenepolymer foil covered by a metallic coating.

The shape of stripe 52 may be defined by its corners which, in FIG. 3, beginning with the left upper corner and proceeding clockwise are designated 80, 82, 84, 86, 88, 90, 92, and 94. This designation is helpful for the understanding of FIG. 4.

A line section 98 is connected to a first point 96 in the middle between corners 80 and 94 of first lateral side 64. Line section 98 leads to a first terminal 100. Correspondingly, on the right side between corners 86 and 88 of second lateral side 78 there is a point 102 from which a line section 104 leads to a second terminal 106. One can see here that due to the small widths $b_1$ and $b_2$ of sections 54 and 58 it is sufficient for the scroll coil 50 of the present invention to make the connection only via one line section 98 and 104, resp., which means a simplification of the design. It goes, however, without saying that one may use one line section each per corner 80, 86, 88, and 94, if necessary.

In order to manufacture scroll coil 50 for an operational, wound condition, stripe 52 is wound spirally as shown in FIGS. 4 and 5.

One can see that stripe 52 is wound such that middle section 56 entwines an arc of almost 360°, wherein only a narrow gap remains between slanted longitudinal sides 66 and 72, and a small distance between corners 82 and 90 (shown out of scale and exaggeratedly large in FIG. 4 for a better understanding). Thereby, a cylindrical inner space 108 is created about a longitudinal axis 107 into which a sample vessel 109 may be inserted.

As cylindrical inner space 108 is almost entirely surrounded by broad middle section 56 and its conductive surface, there is no deterioration as compared to prior art scroll coil 10 of FIGS. 1 and 2 with regard to the distribution of the radio frequency field. The sample is surrounded by only one coil winding over its entire length so that there is a particularly intensive and homogeneous magnetic radio frequency field and only a very weak electrical radio frequency field at the location of the sample. The latter effect results in a small frequency offset for different samples and in an only small dependence of the resonant circuit specifications from the kind of sample. This is of particular importance for salt containing samples.

Left section 54 and right section 58 are each wound one time about middle section 56, as one can see from the top plan view of FIG. 5. When these sections 54 and 58 are configured correspondingly longer, they may also be wound several times about middle section 56. Generally speaking, lateral sections 54 and 58 may, in a wound condition, entwine an angle being equal to an integer multiple of 180°, i.e. 180°, 260°, 540° and so forth.

When doing so, right section 54 and left section 58 must keep only a radial distance Δr from middle section 56. The radial distance between right section 54 and left section 58 shown in FIG. 5 for a better understanding, must not be kept because these sections are arranged one above the other in an axial direction and do not touch due to distance Δb (FIG. 3). Unlike shown in FIG. 5 they may extend flush with each other in an axial direction. Terminals 100 and 106 may be configured one besides the other, provided sections 54 and 58 are made with essential the same length. In contrast to prior art scroll coils as shown in FIGS. 1 and 2, there are no crossed lines guiding outwardly.

Figure 6:
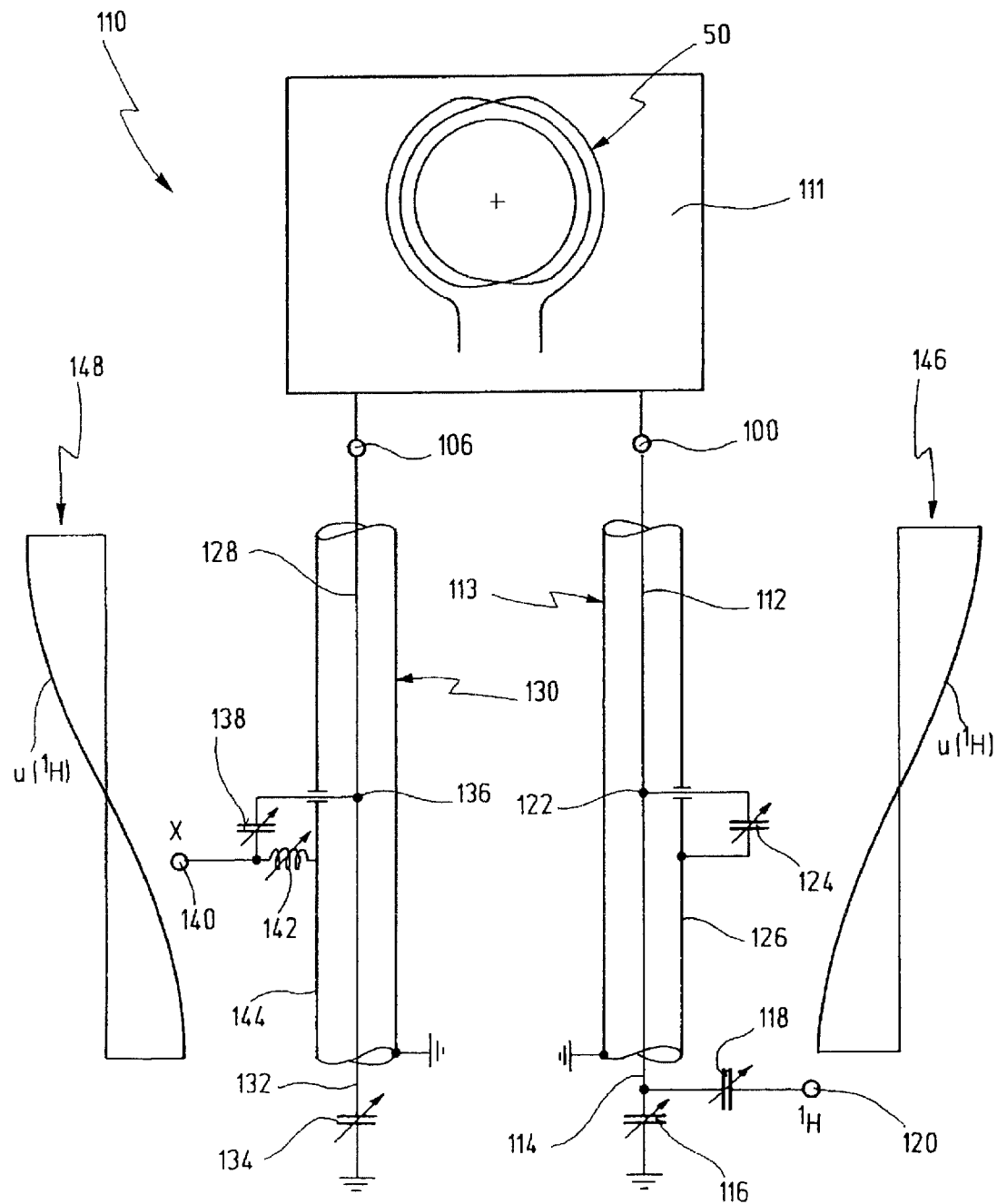
FIG. 6 shows an embodiment of a probe head according to the invention, having a coil according to FIG. 4.

FIG. 6 shows an embodiment of an inventive probe head 110 comprising a radio frequency coil arrangement 111 being configured by utilizing scroll coil 50.

First terminal 100 is connected to an upper end of an inner conductor of a first $\lambda/2(^1H)$ line 113. An opposite, lower end 114 of inner conductor 112 is connected to ground via a first tuning capacitor 116, and is connected to a third terminal 120 via a second tuning capacitor 118. Third terminal 120 is provided for feeding and for receiving, resp., radio frequency signals for nuclei of a first kind of nuclei, in particular for protons ($^1H$). This is the kind of nuclei or the wave length of the corresponding frequency, resp., to which the given length $\lambda/2(^1H)$ for first line 113 is related.

A third tuning capacitor 124 is arranged between a middle tap 122 of inner conductor 112 and a grounded outer conductor 126 of first $\lambda/2(^1H)$ line 113.

An upper end of an inner conductor 128 of a second $\lambda/2(^1H)$ line 130 is connected to second terminal 106. An opposite, lower end 132 is connected to ground via a fourth tuning capacitor 134. A middle tap 136 of inner conductor 128 leads to a fourth terminal 140 via a fifth tuning capacitor 138. Fourth terminal 140, further, is connected to an outer conductor 144 of second $\lambda/2(^1H)$ line 130 via a tuning inductivity 142. Fourth terminal 140 is adapted to feeding and receiving, resp., a signal from nuclei of a second kind of nuclei, for example $^{15}N$ or $^{31}P$.

Radio frequency coil arrangement 111, therefore, is driven symmetrically via the two lines 113 and 130. The course of the radio frequency voltage u($^1H$) on lines 113 and 130 is shown in FIG. 6 with diagrams 146 and 148. One can see from diagrams 146 and 148 that both terminals 100 and 106 are "hot", i.e, are at maximum voltage u($^1H$).

This symmetric circuit of a sample coil is described in older German patent application 103 61 347.1-15 of the same applicant as the present application. It is not mandatory, insofar to use two $\lambda/2$ lines. Instead, other lines may likewise be used having a length corresponding to certain multiples of a quarter wave length of the first and/or the second kind of nuclei.

Scroll coil 50 is operated at its resonant frequency, preferably at a frequency being somewhat below its resonant frequency, for example up to 5% below the resonance frequency.

If, in the present application, dimensions are given like "equal length" or "three times as long" or "by 180°" or the like, be it in conjunction with terms like "essentially", "about", "approximately" or the like, or not, it goes without saying that this encompasses dimensions that are slightly different, by, say, 5%, provided that essentially the same technical effects are achieved. The same applies, mutatis mutandis for frequency values etc.

What is claimed is:

1. A radio frequency coil arrangement for magnetic resonance measurements comprising a scroll coil having a stripe being spirally wound about a longitudinal axis, ends of said stripe being connected to terminals for feeding and/or receiving radio frequency signals, wherein said stripe, as seen in a plane unwound view, is configured in a Z-shape, with a middle, broad section as well as two lateral, narrow sections, said lateral sections being offset with respect to each other in a lateral direction, such that said lateral sections do not overlap in said lateral direction when said stripe is wound.

2. The radio frequency coil arrangement of claim 1, wherein said lateral sections are arranged at a distance with respect to each other in said lateral direction.

3. The radio frequency coil arrangement of claim 2, wherein said middle section is three times as wide as said lateral sections.

4. The radio frequency coil arrangement of claim 1, wherein said middle section is configured slanted in a transition to said lateral sections.

5. The radio frequency coil arrangement of claim 1, wherein said middle section is configured arcuate in a transition to said lateral sections.

6. The radio frequency coil arrangement of claim 1, wherein said middle section, when in a wound condition, entwines said longitudinal axis by an angle of 360°.

7. The radio frequency coil arrangement of one of claims 1-6, wherein said lateral sections, when in a wound condition, each entwine said longitudinal axis by an angle of 360°.

8. The radio frequency coil arrangement of claim 1, wherein said lateral sections have equal lengths.

9. The radio frequency coil arrangement of claim 1, wherein said lateral sections, when in a wound condition, entwine said longitudinal axis by an angle of an integer multiple of 180°.

10. The radio frequency coil arrangement of claim 8, wherein said middle section has a same length as said lateral sections.

11. The radio frequency coil arrangement of claim 1, wherein said terminals are coupled to a center of lateral sides of said lateral sections.

12. The radio frequency coil arrangement of claim 1, wherein said stripe, when in a wound condition, encircles an inner space for a sample volume in a range of between 10 to 100 μl.

13. The radio frequency coil arrangement of claim 1, wherein said scroll coil is designed for a resonance frequency in a range of between 400 to 1,000 MHz.

14. The radio frequency coil arrangement of claim 13, wherein it is operated in said range of said resonance frequency of said scroll coil.

15. The radio frequency coil arrangement of claim 13, wherein it is operated slightly below said resonance frequency.

16. A probe head for measuring resonance signals utilizing a radio frequency coil arrangement of claim 1, wherein said radio frequency coil arrangement is driven symmetrically at terminals of said scroll coil.

17. The probe head of claim 16, wherein said terminals are each connected to an end of an inner conductor of lines, resp., having a length being essentially equal to one half wave length of a first measuring frequency for nuclei of a first kind of nuclei, wherein signals of said first measuring frequency are fed to or received from, resp., an opposite end of one of said inner conductor.

18. The probe head of claim 17, wherein signals of a second measuring frequency for nuclei of a second kind of nuclei are fed to or received from, resp., a middle tap of another inner conductor.

\* \* \* \* \*